United States Patent
Cho et al.

(10) Patent No.: US 9,831,159 B2
(45) Date of Patent: Nov. 28, 2017

(54) SEMICONDUCTOR PACKAGE WITH EMBEDDED OUTPUT INDUCTOR

(71) Applicant: Infineon Technologies Americas Corp., El Segundo, CA (US)

(72) Inventors: Eung San Cho, Torrance, CA (US); Darryl Galipeau, Warwick, RI (US); Danny Clavette, Greene, RI (US)

(73) Assignee: Infineon Technologies Americas Corp., El Segundo, CA (US)

( * ) Notice: Subject to any disclaimer, the term of this patent is extended or adjusted under 35 U.S.C. 154(b) by 0 days.

(21) Appl. No.: 15/132,943

(22) Filed: Apr. 19, 2016

(65) Prior Publication Data

US 2016/0365304 A1     Dec. 15, 2016

Related U.S. Application Data

(60) Provisional application No. 62/172,947, filed on Jun. 9, 2015.

(51) Int. Cl.

| | | |
|---|---|---|
| H01L 23/64 | (2006.01) | |
| H01L 23/495 | (2006.01) | |
| H01L 21/48 | (2006.01) | |
| H01L 23/522 | (2006.01) | |
| H01L 27/06 | (2006.01) | |
| H01L 29/16 | (2006.01) | |
| H02M 7/00 | (2006.01) | |
| H01L 23/00 | (2006.01) | |

(52) U.S. Cl.
CPC .... *H01L 23/49541* (2013.01); *H01L 21/4853* (2013.01); *H01L 23/495* (2013.01); *H01L 23/49524* (2013.01); *H01L 23/49537* (2013.01); *H01L 23/49562* (2013.01); *H01L 23/49575* (2013.01); *H01L 23/5227* (2013.01); *H01L 23/645* (2013.01); *H01L 24/40* (2013.01); *H01L 27/0617* (2013.01); *H01L 29/16* (2013.01); *H02M 7/003* (2013.01); *H01L 2224/40245* (2013.01); *H01L 2924/181* (2013.01)

(58) Field of Classification Search
CPC .. H01L 23/5227; H01L 27/0207; H01L 27/13
See application file for complete search history.

(56) References Cited

U.S. PATENT DOCUMENTS

| | | | | |
|---|---|---|---|---|
| 2009/0134503 | A1* | 5/2009 | Feng | H01F 17/0033 257/673 |
| 2011/0169596 | A1* | 7/2011 | Ahrens | H01L 23/5227 336/200 |
| 2014/0110796 | A1* | 4/2014 | Cho | H01L 24/92 257/401 |

* cited by examiner

*Primary Examiner* — Daniel Luke
(74) *Attorney, Agent, or Firm* — Shumaker & Sieffert, P.A.

(57) ABSTRACT

In one implementation, a semiconductor package includes a control transistor and a sync transistor of a power converter switching stage attached over a first patterned conductive carrier, as well as a magnetic material situated over leads of the first patterned conductive carrier. The semiconductor package also includes a second patterned conductive carrier attached over the first patterned conductive carrier, the control and sync transistors, and the magnetic material. Leads of the second patterned conductive carrier overlie the magnetic material and are coupled to the leads of the first patterned conductive carrier so as to form windings of an output inductor for the power converter switching stage, the output inductor being integrated into the semiconductor package.

18 Claims, 8 Drawing Sheets

SEMICONDUCTOR PACKAGE WITH EMBEDDED OUTPUT INDUCTOR

BACKGROUND

The present application claims the benefit of and priority to a provisional application entitled "Power Semiconductor Package with Conductive Clip and Embedded Inductor," Ser. No. 62/172,947 filed on Jun. 9, 2015. The disclosure in this pending provisional application is hereby incorporated fully by reference into the present application.

BACKGROUND ART

Power converters, such as voltage regulators, are used in a variety of electronic circuits and systems. Many integrated circuit (IC) applications, for instance, require conversion of a direct current (DC) input voltage to a lower, or higher, DC output voltage. For example, a buck converter may be implemented to convert a higher voltage DC input to a lower voltage DC output for use in low voltage applications in which relatively large output currents are required.

The switching stage of a power converter typically includes a high side control transistor and a low side synchronous (sync) transistor, and may include a driver IC designed to drive the control and/or sync transistors. In addition, power converter circuitry typically includes a relatively large output inductor for the switching stage. Consequently, conventional approaches to implementing a power converter on a printed circuit board (PCB) require PCB area sufficient to accommodate a side-by-side layout including not only a package containing the control and sync transistors of the power converter switching stage, but the output inductor for the switching stage as well.

SUMMARY

The present disclosure is directed to a semiconductor package with embedded output inductor, substantially as shown in and/or described in connection with at least one of the figures, and as set forth in the claims.

DETAILED DESCRIPTION

The following description contains specific information pertaining to implementations in the present disclosure. One skilled in the art will recognize that the present disclosure may be implemented in a manner different from that specifically discussed herein. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

As stated above, power converters, such as voltage regulators, are used in a variety of electronic circuits and systems. For instance, integrated circuit (IC) applications may require conversion of a direct current (DC) input voltage to a lower, or higher, DC output voltage. As a specific example, a buck converter may be implemented as a voltage regulator to convert a higher voltage DC input to a lower voltage DC output for use in low voltage applications in which relatively large output currents are required.

Figure 1:
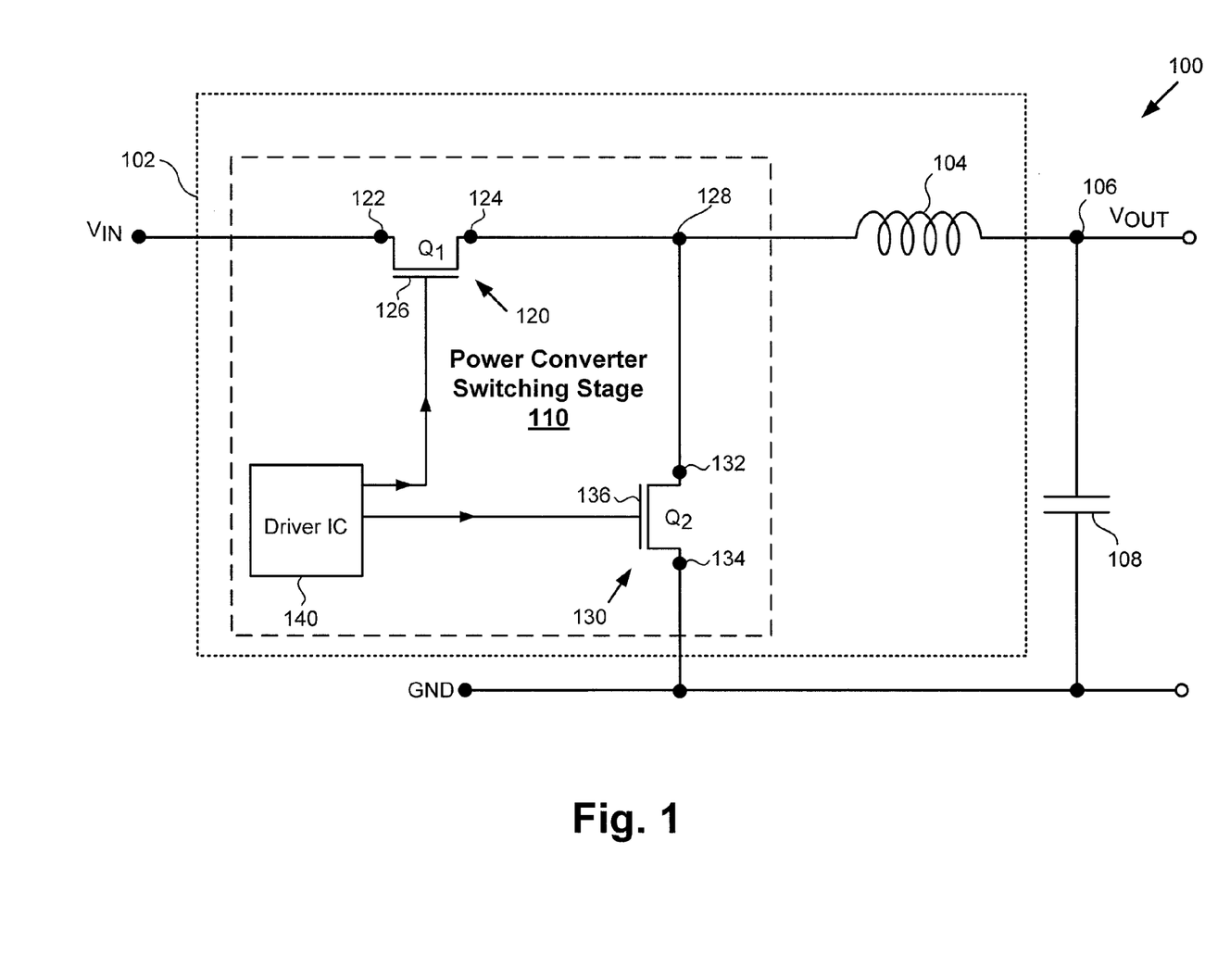
FIG. 1 shows a diagram of an exemplary power converter.

FIG. 1 shows a diagram of an exemplary power converter. Power converter 100 includes semiconductor package 102 and output capacitor 108 coupled between output 106 of semiconductor package 102 and ground. As shown in FIG. 1, semiconductor package 102 includes power converter switching stage 110 and output inductor 104 for power converter switching stage 110. As further shown in FIG. 1, power converter 100 is configured to receive an input voltage $V_{IN}$, and to provide a converted voltage, e.g., a rectified and/or stepped down voltage, as $V_{OUT}$ at output 106.

Power converter switching stage 110 may be implemented using two power switches in the form of metal-oxide-semiconductor field-effect transistors (MOSFETs) configured as a half bridge, for example. That is to say, power converter switching stage 110 may include high side or control FET 120 ($Q_1$) having drain 122, source 124, and gate 126, as well as low side or synchronous (sync) FET 130 ($Q_2$) having drain 132, source 134, and gate 136. As shown in FIG. 1, control FET 120 is coupled to sync FET 130 at switch node 128, which, in turn, is coupled to output 106 of semiconductor package 102 through output inductor 104. As also shown in FIG. 1, output inductor 104 for power converter switching stage 110 is integrated into semiconductor package 102, such as by being embedded into semiconductor package 102, as described in greater detail below.

According to the exemplary implementation shown in FIG. 1, power converter switching stage 110 includes driver IC 140 for driving control FET 120 and sync FET 130. It is noted, however, that the inclusion of driver IC 140 in power converter switching stage 110 is optional. Thus, in other implementations, power converter switching stage 110, as well as semiconductor package 102 for power converter switching stage 110 and integrated output inductor 104, may not include driver IC 140.

Respective control and sync FETs 110 and 120 may be implemented as group IV based power FETs, such as silicon power MOSFETs having a vertical design, for example. Power converter 100 may be advantageously utilized, for example as a buck converter, in a variety of automotive, industrial, appliance, and lighting applications. It is noted that in the interests of ease and conciseness of description, the present inventive principles will in some instances be described by reference to specific implementations of a buck converter including one or more silicon based power FETs. However, it is emphasized that such implementations are merely exemplary, and the inventive principles disclosed herein are broadly applicable to a wide range of applications, including buck and boost converters, implemented using other group IV material based, or group III-V semiconductor based, power transistors.

It is further noted that as used herein, the phrase "group III-V" refers to a compound semiconductor including at least one group III element and at least one group V element. By way of example, a group III-V semiconductor may take the form of a III-Nitride semiconductor that includes nitrogen and at least one group III element. For instance, a III-Nitride power FET may be fabricated using gallium nitride (GaN), in which the group III element or elements include some or a substantial amount of gallium, but may also include other group III elements in addition to gallium. Thus, in some implementations, one or both of control FET 120 and sync FET 130 may take the form of a III-Nitride power FET, such as a III-Nitride high electron mobility transistor (HEMT).

Figure 2:
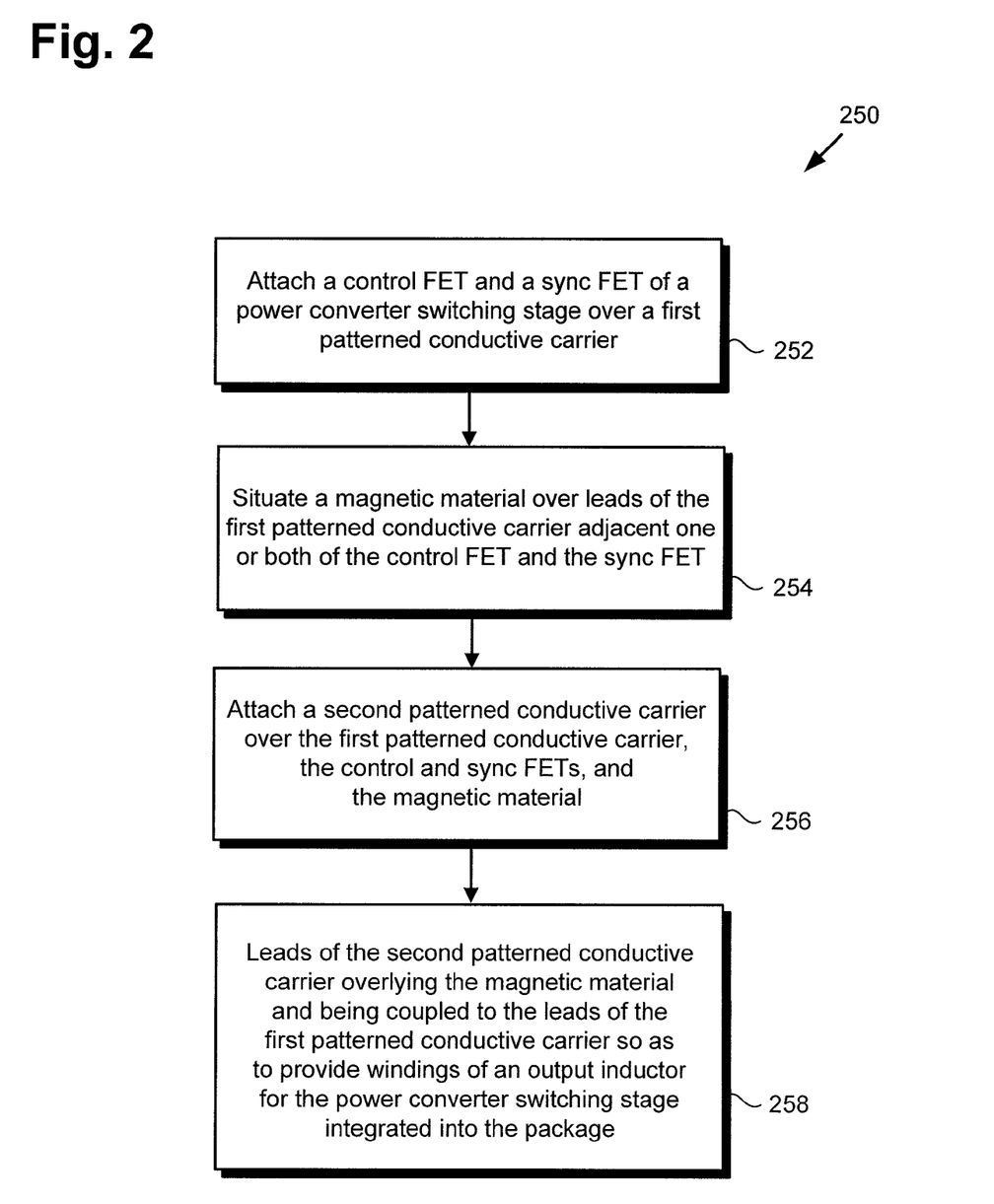
FIG. 2 shows a flowchart presenting an exemplary method for fabricating a semiconductor package with embedded output inductor, according to one implementation.

Continuing to FIG. 2, FIG. 2 shows flowchart 250 presenting an exemplary method for fabricating a semiconductor package with embedded output inductor. The exemplary method described by flowchart 250 is performed on a portion of a conductive carrier structure, which may be a semiconductor package lead frame, or may take the form of a conductive sheet or plate, for example.

Figure 3A:
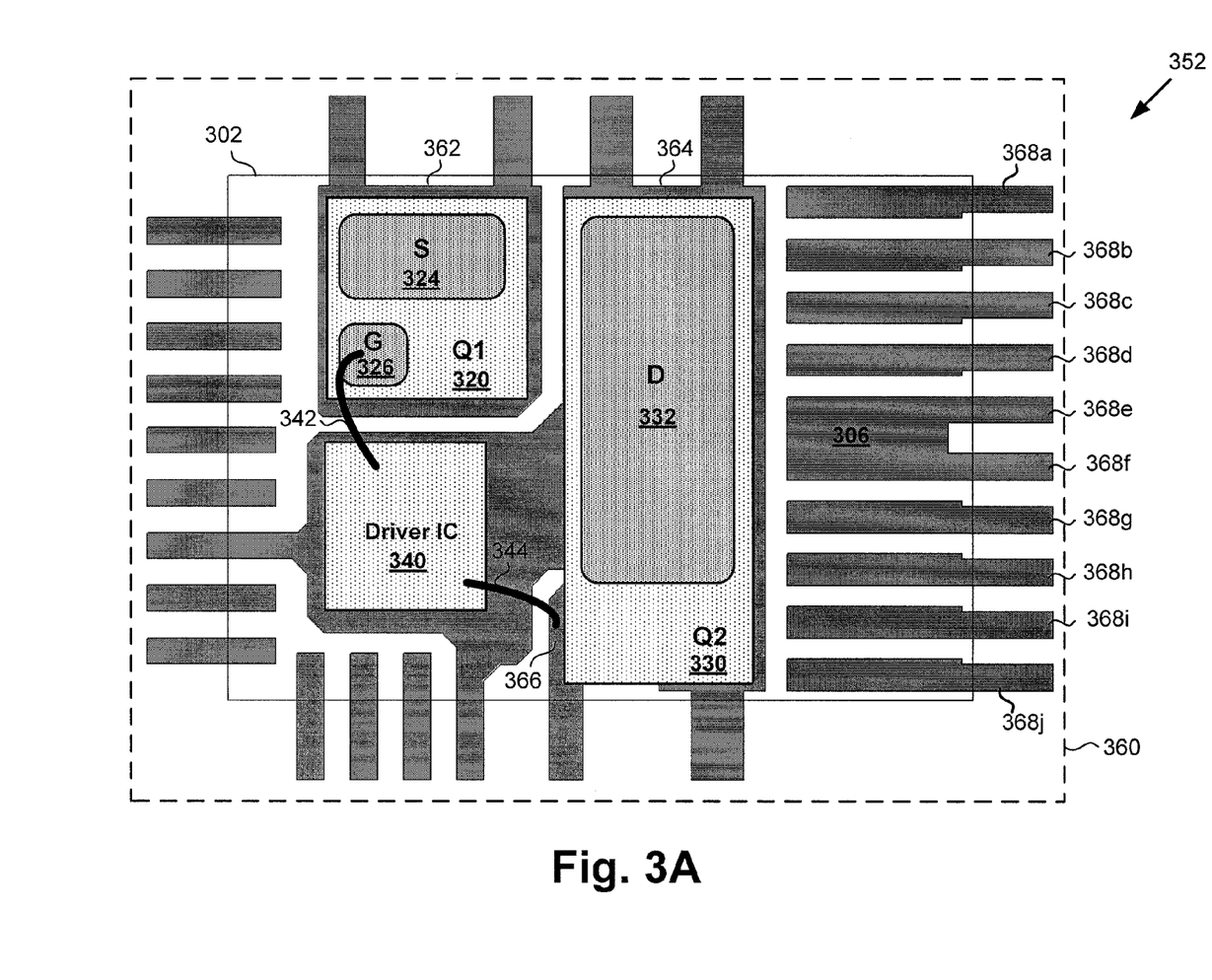
FIG. 3A shows a top view illustrating a result of performing an initial action according to the exemplary flowchart of FIG. 2, in accordance with one implementation.
Figure 3B:
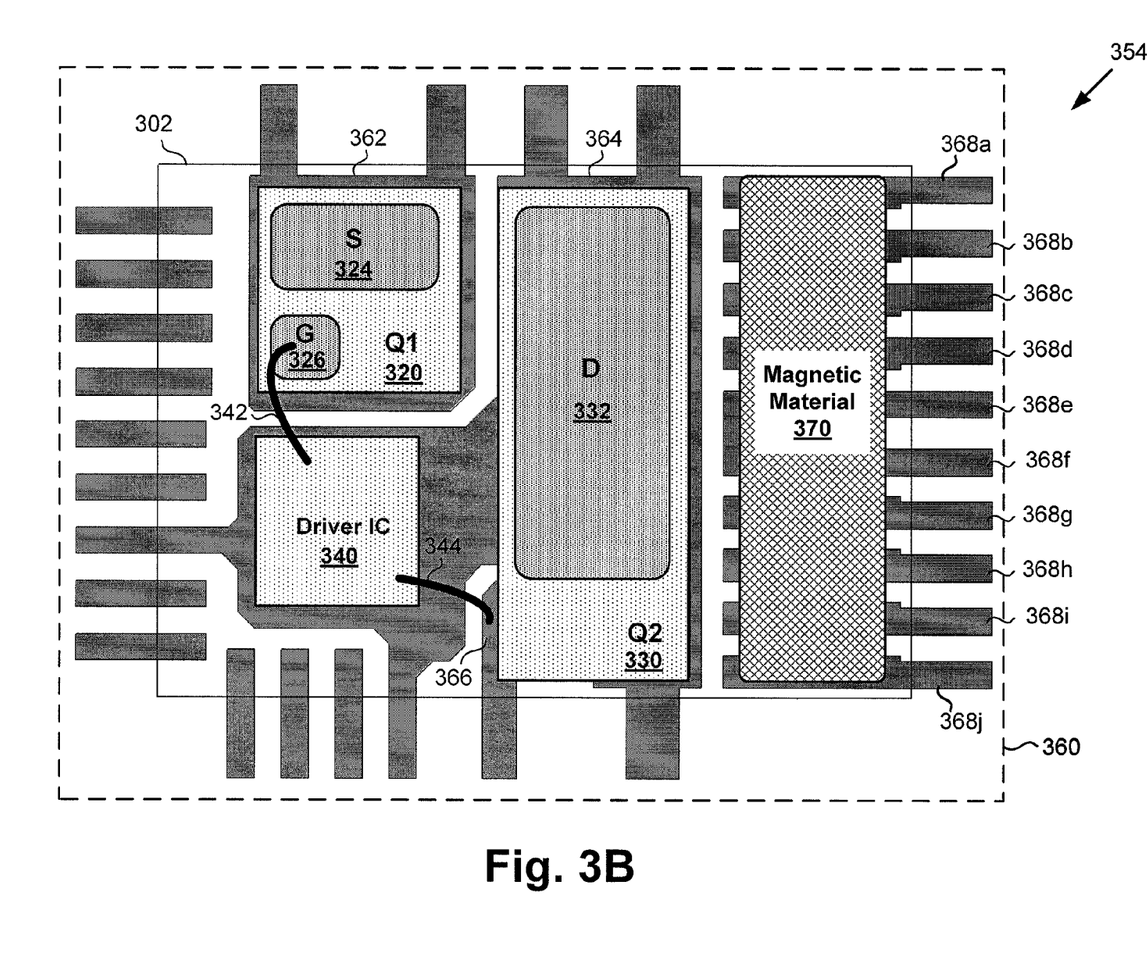
FIG. 3B shows a top view illustrating a result of performing a subsequent action according to the exemplary flowchart of FIG. 2, in accordance with one implementation.
Figure 3C:
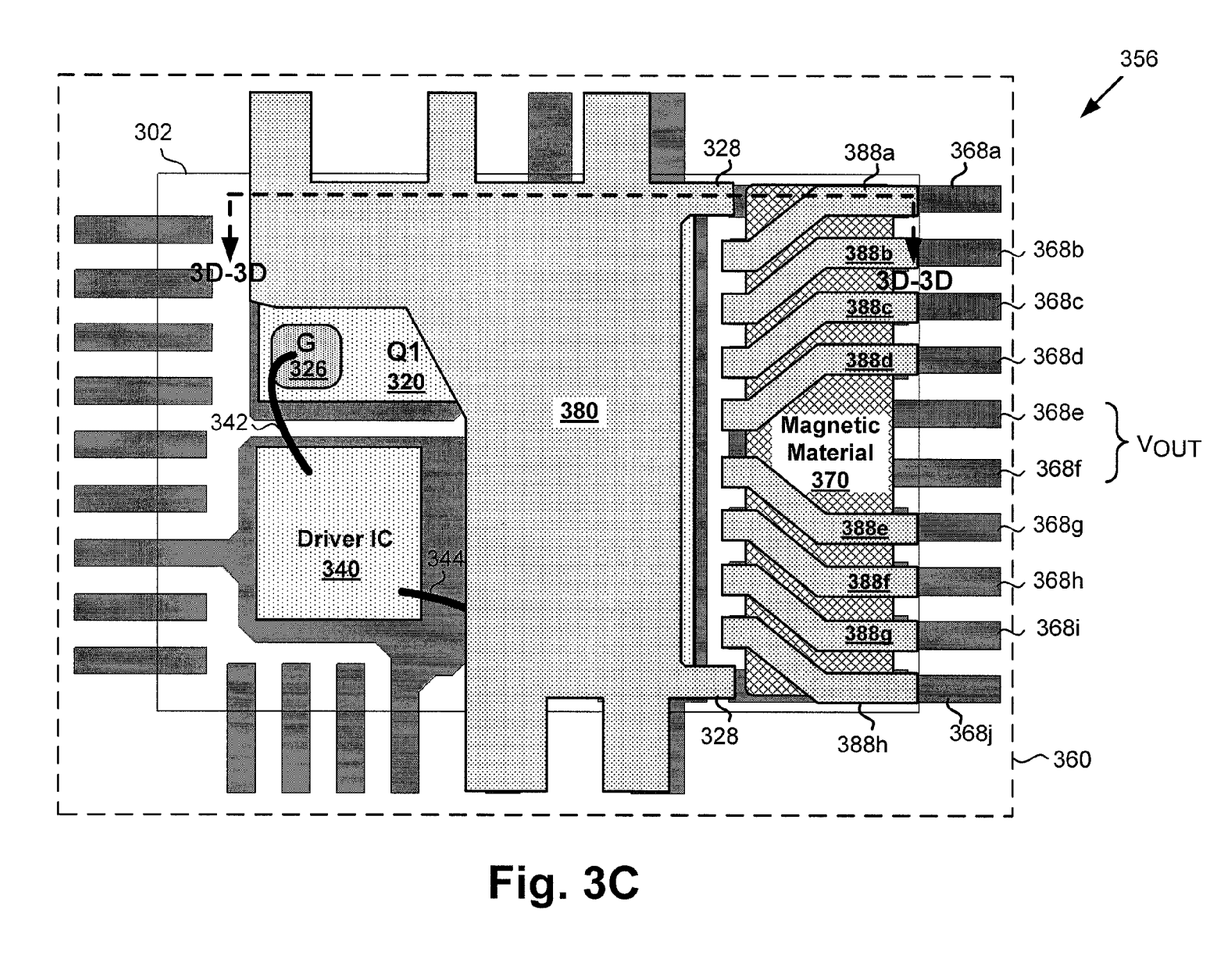
FIG. 3C shows a top view illustrating a result of performing a subsequent action according to the exemplary flowchart of FIG. 2, in accordance with one implementation.

With respect to FIGS. 3A, 3B, 3C, and 3D (hereinafter "FIGS. 3A-3D"), structures 352, 354, 356, and 358 shown respectively in those figures illustrate the result of performing the method of flowchart 250, according to one implementation. For example, structure 352 in FIG. 3A represents first patterned conductive carrier 360 having control FET 320 and sync FET 330 attached thereover (action 252). Structure 354 in FIG. 3B shows magnetic material 370 situated over leads 368a, 368b, 368c, 368d, 368e, 368f, 368g, 368h, 368i, and 368j (hereinafter "leads 368a-368j") of first patterned conductive carrier 360 (action 254). Structure 356 in FIG. 3C shows second patterned conductive carrier 380 attached over first patterned conductive carrier 360, control and sync FETs 320 and 330, and magnetic material 370 (action 256), and so forth.

Referring to flowchart 250, in FIG. 2, in combination with FIGS. 1 and 3A, flowchart 250 begins with attaching control FET 320 and sync FET 330 of power converter switching stage 110 over first patterned conductive carrier 360 (action 252). First patterned conductive carrier 360 may be a fully patterned conductive carrier for use as part of semiconductor package 302, which is shown in outline in FIG. 3A. As also shown in FIG. 3A, first patterned conductive carrier 360 has multiple sections including control drain segment 362, sync source segment 364, sync gate segment 366, and leads 368a-368j. It is noted that according to the exemplary implementation shown in FIG. 3A, leads 368e and 368f of first patterned conductive carrier 360 provide output 306 of semiconductor package 302. Output 306 of semiconductor package 302 corresponds in general to output 106, in FIG. 1.

First patterned conductive carrier 360 may be formed of any conductive material having a suitably low electrical resistance. Examples of materials from which first patterned conductive carrier 360 may be formed include copper (Cu), aluminum (Al), or a conductive alloy. In one implementation, as noted above, first patterned conductive carrier 360 may be implemented using at least a portion of a semiconductor package lead frame.

According to the exemplary implementations shown in FIG. 3A, semiconductor package 302 includes driver IC 340 for driving control FET 320 and sync FET 330. Semiconductor package 302, control FET 320, sync FET 330, and driver IC 340 correspond respectively in general to semiconductor package 102, control FET 120, sync FET 130, and driver IC 140, in FIG. 1, and may share any of the characteristics attributed to those corresponding features in the present application. In other words, and as discussed above by reference to FIG. 1, the inclusion of driver IC 340 in semiconductor package 302 is optional. Thus, in other implementations, semiconductor package 302 for control FET 320 and sync FET 330 may not include driver IC 340.

In implementations in which control FET 320 and sync FET 330 take the form of vertical power FETs, the drain of control FET 320 may be attached to control drain segment 362 of first patterned conductive carrier 360 (the drain of control FET 320 being situated on a bottom surface of control FET 320 opposite source 324 and gate 326, and corresponding to drain 122 of control FET 120, in FIG. 1). Analogously, the source and gate of sync FET 330 may be attached to respective sync source segment 364 and sync gate segment 366 of first patterned conductive carrier 360 (the source and gate of sync FET 330 being situated on a surface of sync FET 330 opposite drain 332 and corresponding respectively to source 134 and gate 136 of sync FET 130, in FIG. 1).

Control FET 320 and sync FET 330 may be attached to first patterned conductive carrier 360 using an electrically conductive die attach material (not visible from the perspective shown by FIG. 3A). Moreover, when included in semiconductor package 302, driver IC 340 may be attached to first patterned conductive carrier 360 using the same electrically conductive die attach material used to attach control FET 320 and sync FET 330, or using an electrically insulating die attach material (die attach material for drive IC 340 also not visible from the perspective shown in FIG. 3A).

As shown in FIG. 3A, when present, driver IC 340 may be coupled to gate 326 of control FET 320 by electrical connector 342, and may be coupled to the gate of sync FET 330 by electrical connector 344 and sync gate segment 366 of first patterned conductive carrier. It is noted that although electrical connectors 342 and 344 are depicted as wire bond in FIG. 3A, that representation is merely for the purposes of conceptual clarity. More generally, one or both of electrical connectors 342 and 344 may be implemented as wire bond, as conductive clips, ribbons, or strips, or as vias, such as through-substrate vias, for example.

Moving to structure 354 in FIG. 3B with ongoing reference to FIG. 2, flowchart 250 continues with situating magnetic material 370 over leads 368a-368j of first patterned conductive carrier 360 (action 254). Magnetic material 370 may be any material suitable for use as an inductor core. For example, magnetic material 370 may take the form of a magnetic core, such as a high stability ferrite core of output inductor 104, in FIG. 1.

According to the exemplary implementation shown in FIG. 3B, magnetic material 370 is situated adjacent sync FET 330. That is to say, sync FET 330 is situated between magnetic material 370 and control FET 320, and between magnetic material 370 and driver IC 340 when driver IC is present in semiconductor package 302. However, in other implementations, semiconductor package 302 may be adapted such that magnetic material 370 is situated adjacent sync FET 330 and control FET 320. In those implementations, for example, control FET 320 is situated between magnetic material 370 and driver IC 340 when driver IC is present in semiconductor package 302.

Moving to structure 356 in FIG. 3C, flowchart 250 continues with attaching second patterned conductive carrier 380 over first patterned conductive carrier 360, control and sync FETS 320 and 330, and magnetic material 370 (action 256). As shown in FIG. 3C, second patterned conductive carrier 380 may be a fully patterned conductive carrier having switch node contacts 328, and including oblique leads 388a, 388b, 388c, 388d, 388e, 388f, 388g, and 388h (hereinafter "oblique leads 388a-388h"). Also shown in FIG. 3C are perspective lines 3D-3D.

Like first patterned conductive carrier 360, second patterned conductive carrier 380 may be formed of any conductive material having a suitably low electrical resistance. Examples of materials from which second patterned conductive carrier 380 may be formed include Cu, aluminum Al, or a conductive alloy. In one implementation, second patterned conductive carrier 380 may be implemented using at least a portion of a semiconductor package lead frame. In other words, in various implementations, either or both of first patterned conductive carrier 360 and second patterned conductive carrier 380 may be implemented using a semiconductor package lead frame.

Figure 3D:
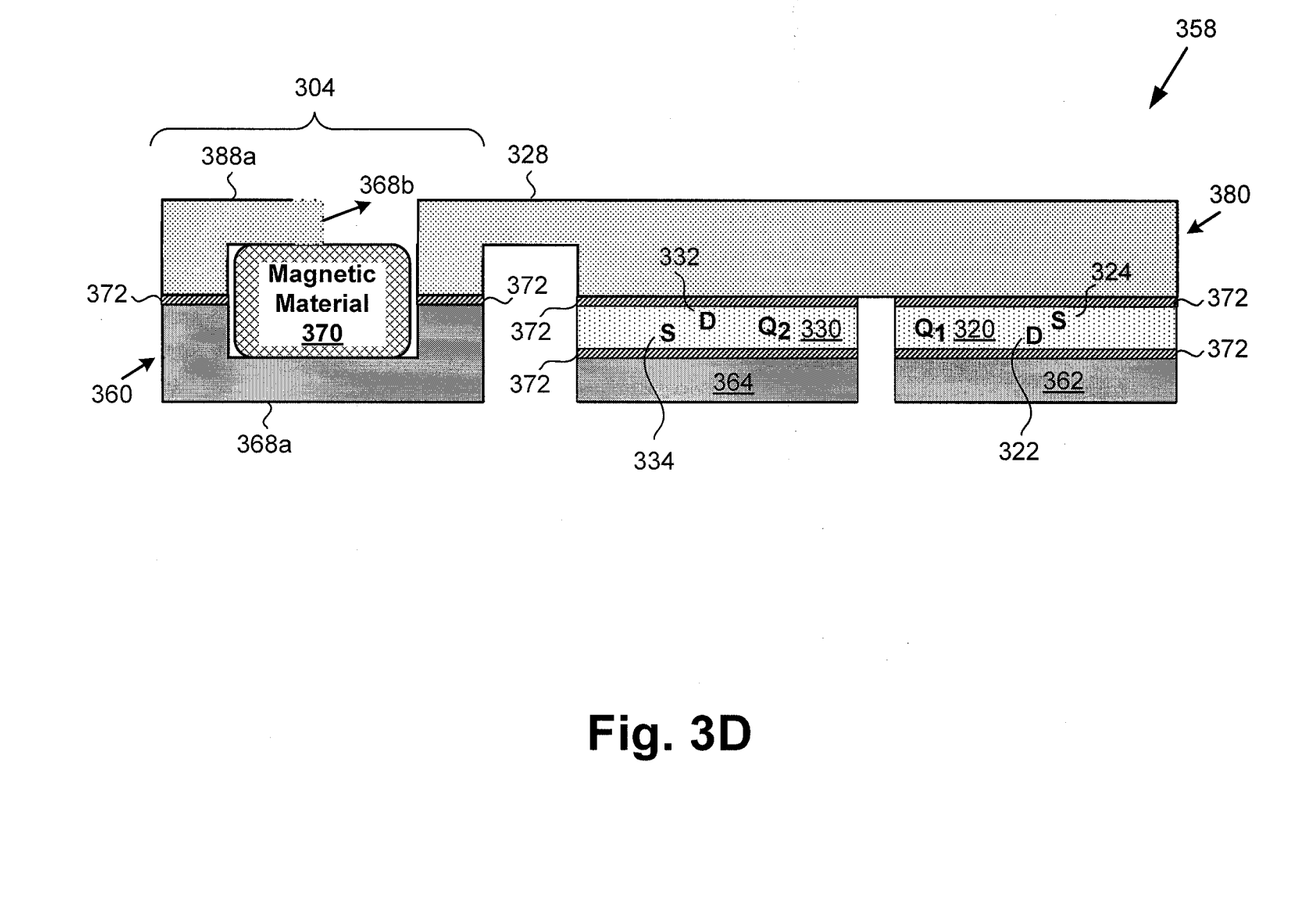
FIG. 3D shows a cross-sectional view of the structure shown in FIG. 3C, illustrating a result of performing a final action according to the exemplary flowchart of FIG. 2, in accordance with one implementation.

Referring to FIG. 3D and continuing to refer to FIG. 3C, FIG. 3D shows structure 358, corresponding to structure 356, in FIG. 3C, viewed along perspective lines 3D-3D in that figure. According to the exemplary method outlined in FIG. 2, flowchart 250 can conclude with oblique leads 388a-388h of second patterned conductive carrier 380 overlying magnetic material 370 and being coupled to leads 368a-368j of first patterned conductive carrier 360 so as to provide windings of output inductor 304.

As shown in FIG. 3D, drain 322 of control FET 320 is attached to control drain segment 362 of first patterned conductive carrier 360 by electrically conductive die attach material 372, while source 334 of sync FET 330 is attached to sync source segment 364 of first patterned conductive carrier 360 by electrically conductive die attach material 372. In addition, electrically conductive die attach material 372 is used to attach source 324 of control FET 320 and drain 332 of sync FET 330 to switch node contact 328 of second patterned conductive carrier 380, as well as to attach switch node contact 328 and oblique lead 388a of second patterned conductive carrier 380 to lead 368a of first patterned conductive carrier 360.

Electrically conductive die attach material 372 may be any suitable substance for use as an electrically conductive adhesive. For example, electrically conductive die attach material 372 may be a conductive epoxy, solder, a conductive sintered material, or a diffusion bonded material, formed to an exemplary thickness of approximately 10 µm or greater.

It is noted that control drain segment 362 and sync source segment 364 may be partially etched segments of first patterned conductive carrier 360. For example, in one implementation, control drain segment 362 and sync source segment 364 may be substantially half-etched segments of first patterned conductive carrier 360. In addition, leads 368a through 368j of first patterned conductive carrier 360 may each include a partially etched portion, such as an approximately half-etched portion, for example, and a substantially non-etched portion. The partially etched portion of lead 368a, as well as all of leads 368a-368j, underlies magnetic material 370 and forms a recess for magnetic material 370 bordered by the substantially non-etched portions.

Oblique leads 388a-388h of second patterned conductive carrier 380 may also each include a partially etched portion, such as an approximately half-etched portion, and a substantially non-etched portion. The partially etched portions of oblique leads 388a-388h overlie magnetic material 370, while the non-etched portions of oblique leads 388a-388h are attached to leads 368a-368j of first patterned conductive carrier 360.

As is evident from FIGS. 3C and 3D, each of oblique leads 388a-388h of second conductive carrier 380 may be coupled to and form an electrically conductive bridge between neighboring leads 368a-368j of first patterned conductive carrier 360. That is to say, oblique lead 388a of second patterned conductive carrier 380 electrically connects lead 368a of first patterned conductive carrier 360 to lead 368b of first conductive carrier. Similarly, oblique lead 388b of second patterned conductive carrier 380 electrically connects lead 368b of first patterned conductive carrier 360 to lead 368c of first conductive carrier, and so forth.

Thus, leads 368a-368j of first patterned conductive carrier 360 and oblique leads 388a-388h of second patterned conductive carrier 380 are electrically coupled to form a continuous winding of output inductor 304 that surrounds magnetic material 370 from lead 368a to lead 368j. As a result, output inductor 304 is integrated into semiconductor package 302 by having magnetic material 370 providing the magnetic core of output inductor 304 embedded within inductor windings provided by leads 368a-368j and oblique leads 388a-388h of respective first and second patterned conductive carriers 360 and 380. Output inductor 304 corresponds in general to output inductor 104 for power converter switching stage 110, in FIG. 1, and may share any of the characteristics attributed to that corresponding feature in the present application.

As shown by FIGS. 3C and 3D, switch node contact 328 of second patterned conductive carrier 380 is attached to source 324 of control FET 320 and to drain 332 of sync FET 330 by electrically conductive die attach material 372. Consequently, switch node contact 328 of second patterned conductive carrier 380 is configured to electrically couple control source 324 of control FET 320 to drain 332 of sync FET 330, as well as to couple source 324 of control FET 320 and drain 332 of sync FET 330 to output inductor 304. In other words, switch node contact 328 corresponds in general to switch node 128, in FIG. 1, and may share any of the characteristics attributed to that corresponding feature in the present application.

According to the exemplary implementation shown by FIGS. 3A-3D, switch node contact 328 of second patterned conductive carrier 380 is coupled to first patterned conductive carrier 360 at lead 368a and at lead 368j, while output 306 of semiconductor package 302 is provided by leads 368e and 368f. It is emphasized, however, that the specific implementation depicted in FIGS. 3A-3D is merely exemplary. In other implementations, switch node contact 328 of second patterned conductive carrier 380 may be coupled to only one of leads 368a or 368j of first patterned conductive carrier 360, while output 306 of semiconductor 302 may be provided by the other of lead 368a or 368j not coupled to switch node contact 328.

Figure 4:
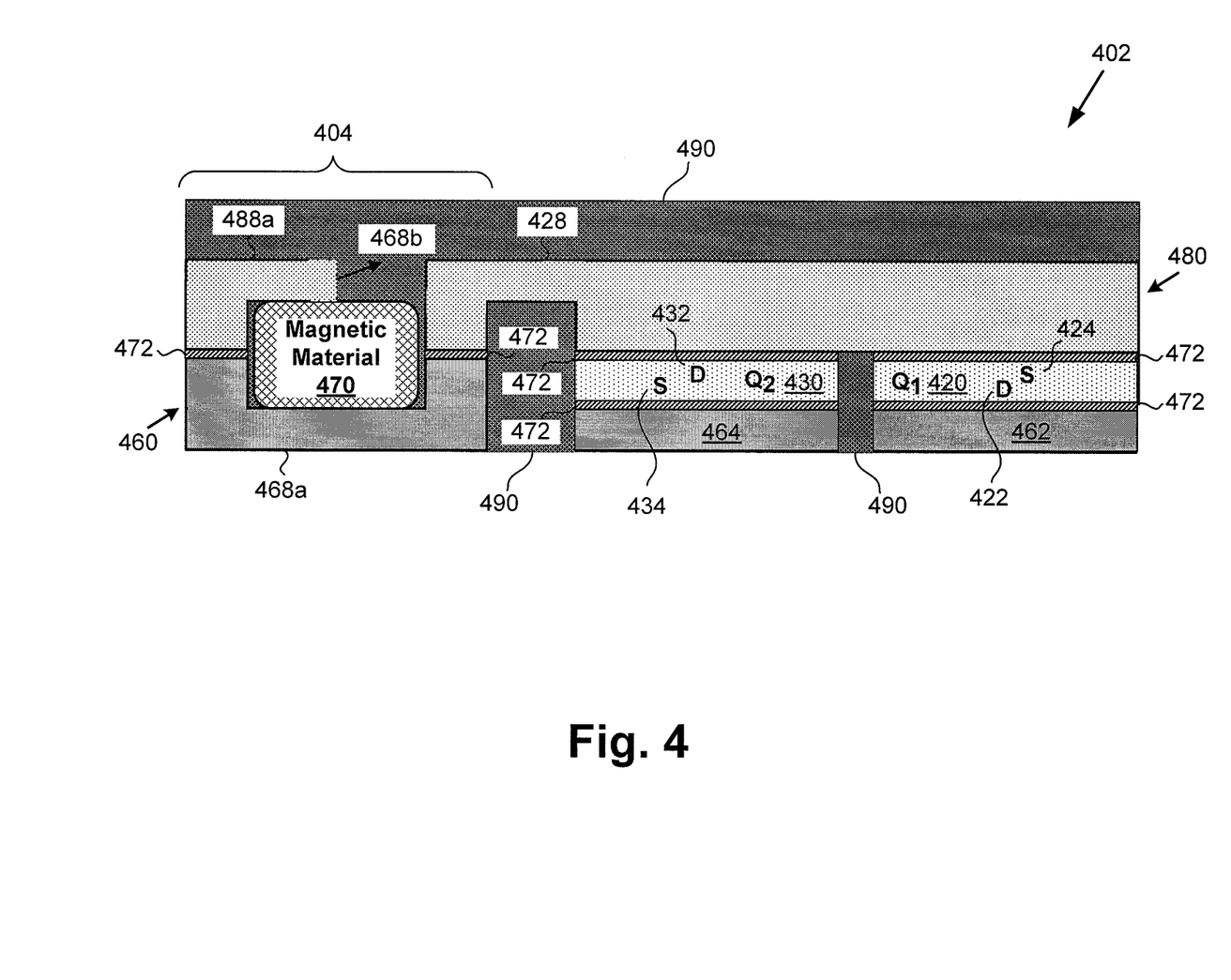
FIG. 4 shows a cross-sectional view of a semiconductor package with embedded output inductor, according to one implementation.

Moving to FIG. 4, FIG. 4 shows a cross-sectional view of semiconductor package 402 with embedded output inductor 404, according to one implementation. It is noted that semiconductor package 402 corresponds in general to semiconductor package 302, in FIGS. 3A-3D, and is viewed from a perspective corresponding to perspective lines 3D-3D, in FIG. 3C.

Semiconductor package 402 includes control FET 420 having drain 422 and source 424, and sync FET 430 having drain 432 and source 434. As shown in FIG. 4, semiconductor package 402 includes first patterned conductive carrier 460 having control drain segment 462, sync source segment 464, and lead 468a. As further shown in FIG. 4, semiconductor package 402 includes second patterned conductive carrier 480 having switch node contact 428 and oblique lead 488a. Also shown in FIG. 4 are output inductor 404 including magnetic material 470, electrically conductive die attach material 472, and packaging encapsulant 490.

Semiconductor package 402 including control FET 420, sync FET 430, and integrated output inductor 404 corresponds in general to semiconductor package 102/302 including control FET 120/320, sync FET 130/330, and integrated output inductor 104/304, in FIGS. 1 and 3A-3D, and may share any of the characteristics attributed to that corresponding feature, above. Moreover, first patterned conductive carrier 460 having control drain segment 462, sync source segment 464, and lead 468a corresponds in general to first patterned conductive carrier 360 having control drain segment 362, sync source segment 364, and leads 368a-368j, and may share any of the characteristics attributed to that corresponding feature, above.

In addition, second patterned conductive carrier 480 having switch node contact 428 and oblique lead 488a corresponds in general to second patterned conductive carrier 380 having switch node contacts 328 and oblique leads 388a-388h, and may share any of the characteristics attributed to that corresponding feature, above. Furthermore, magnetic material 470 and electrically conductive die attach material 472 correspond respectively in general to magnetic material 370 and electrically conductive die attach material 372, in FIGS. 3C and 3D, and may share any of the characteristics attributed to those corresponding features, above. It is noted that packaging encapsulant 490 may be any suitable dielectric molding compound or encapsulation material typically used in semiconductor packaging.

As indicated in FIG. 4, oblique lead 488a of second conductive carrier 480 is coupled to and forms an electrically conductive bridge between lead 468a and its neighboring lead 468b of first patterned conductive carrier 460. That is to say, oblique lead 488a of second patterned conductive carrier 480 electrically connects lead 468a of first patterned conductive carrier 460 to lead 468b of first patterned conductive carrier 460.

Thus, lead 468a of first patterned conductive carrier 460, and oblique lead 488a of second patterned conductive carrier 480 are electrically coupled to form a portion of a continuous winding of output inductor 404 that surrounds magnetic material 470 from lead 468a to a lead corresponding to lead 368j, in FIG. 3C. As a result, output inductor 404 is integrated into semiconductor package 402 by having magnetic material 470 providing the magnetic core of output inductor 404 embedded within inductor windings provided in part by lead 468a and oblique lead 488a of respective first and second patterned conductive carriers 460 and 480.

Figure 5:
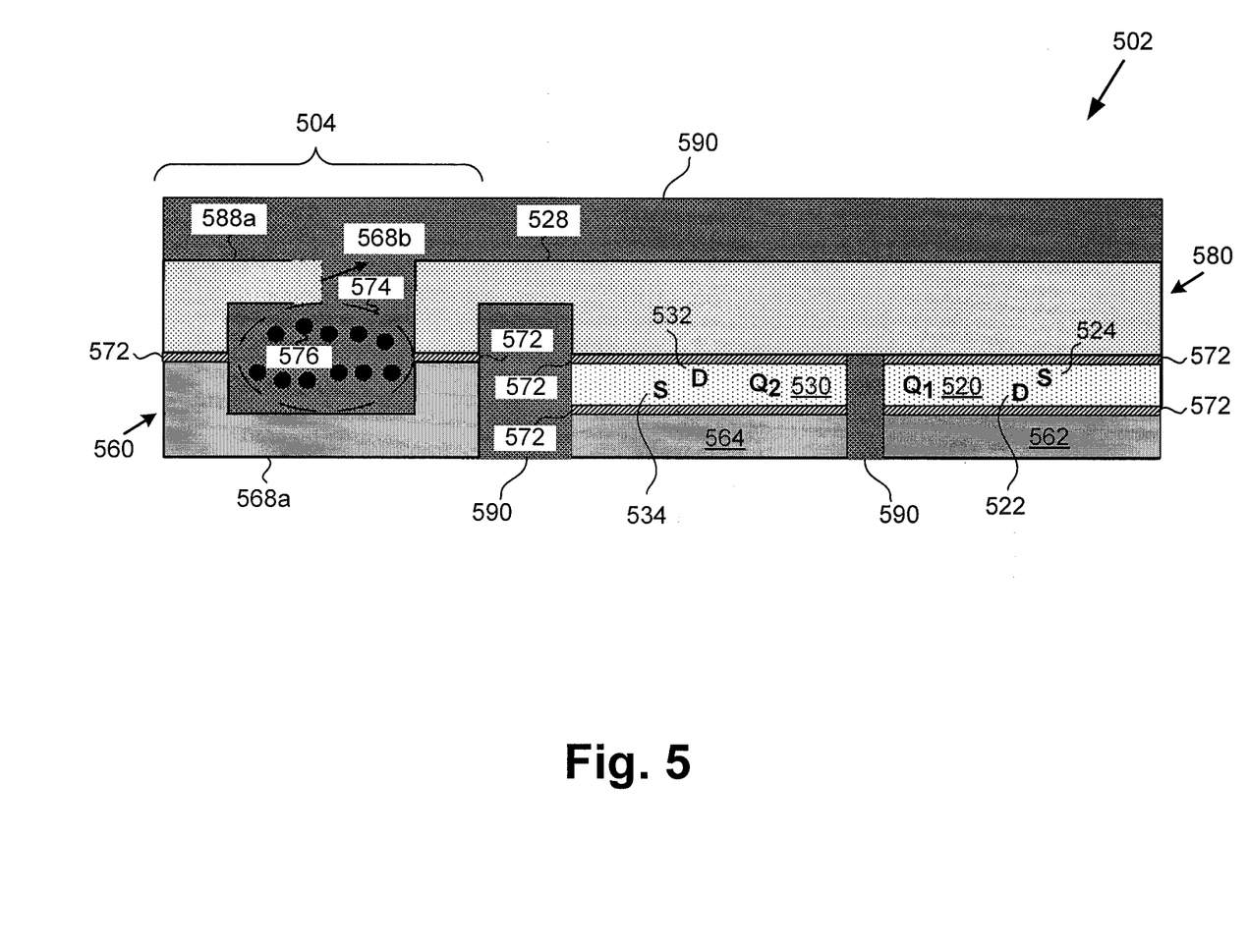
FIG. 5 shows a cross-sectional view of a semiconductor package with embedded output inductor, according to another implementation.

Continuing to FIG. 5, FIG. 5 shows a cross-sectional view of semiconductor package 502 with embedded output inductor 504, according to another implementation. It is noted that semiconductor package 502 corresponds in general to semiconductor package 302, in FIGS. 3A-3D, and is viewed from a perspective corresponding to perspective lines 3D-3D, in FIG. 3C.

Semiconductor package 502 includes control FET 520 having drain 522 and source 524, and sync FET 530 having drain 532 and source 534. As shown in FIG. 5, semiconductor package 502 includes first patterned conductive carrier 560 having control drain segment 562, sync source segment 564, and lead 568a. As further shown in FIG. 5, semiconductor package 502 includes second patterned conductive carrier 580 having switch node contact 528 and oblique lead 588a. Also shown in FIG. 5, are output inductor 504 including magnetic material 574, electrically conductive die attach material 572, and packaging encapsulant 590.

Semiconductor package 502 including control FET 520, sync FET 530, and integrated output inductor 504 corresponds in general to semiconductor package 102/302 including control FET 120/320, sync FET 130/330, and integrated output inductor 104/304, in FIGS. 1 and 3A-3D, and may share any of the characteristics attributed to that corresponding feature, above. Moreover, first patterned conductive carrier 560 having control drain segment 562, sync source segment 564, and lead 568a corresponds in general to first patterned conductive carrier 360 having control drain segment 362, sync source segment 364, and leads 368a-368j, and may share any of the characteristics attributed to that corresponding feature, above.

In addition, second patterned conductive carrier 580 having switch node contact 528 and oblique lead 588a corresponds in general to second patterned conductive carrier 380 having switch node contacts 328 and oblique leads 388a-388h, and may share any of the characteristics attributed to that corresponding feature, above. It is noted that electrically conductive die attach material 572 corresponds in general to electrically conductive die attach material 372, in FIG. 3D, and may share any of the characteristics attributed to that corresponding feature, above. It is further noted that packaging encapsulant 590 may be any suitable dielectric molding compound or encapsulation material typically used in semiconductor packaging.

However, semiconductor package 502 differs from semiconductor package 302 in that according to the present implementation, magnetic material 574 of output inductor 504 is provided by packaging encapsulant 590, which may be a molding compound impregnated with magnetic particles 576, for example. Magnetic particles 576 may be ferrite particles, for instance, which may be dispersed in packaging encapsulant 590 between lead 568a and oblique lead 588a, as well as between all other leads of first patterned conductive carrier 560 and oblique leads of second patterned conductive carrier 580 providing windings of output inductor 504.

With respect to the windings of output inductor 504, it is noted that oblique lead 588a of second conductive carrier 580 is coupled to and forms an electrically conductive bridge between lead 568a and its neighboring lead 568b of first patterned conductive carrier 560. That is to say, lead 568a of first patterned conductive carrier 560, and oblique lead 588a of second patterned conductive carrier 580 are electrically coupled to form a portion of a continuous winding of output inductor 504 that surrounds magnetic material 574 including magnetic particles 576, from lead 568a to a lead corresponding to lead 368j, in FIG. 3C. As a result, output inductor 504 is integrated into semiconductor package 502 by having magnetic material 574 of output inductor 504 embedded within inductor windings provided in part by lead 568a and oblique lead 588a of respective first and second patterned conductive carriers 560 and 580.

Thus, the present application discloses a semiconductor package with embedded output inductor that provides a highly compact design for packaging a power converter switching stage suitable for use as a voltage regulator. By coupling leads of a first patterned conductive carrier to oblique leads of a second patterned conductive carrier, the implementations disclosed herein enable use of the leads and the oblique leads as windings of an output inductor having its magnetic core situated between the first and second patterned conductive carriers. Consequently, the packaging solutions disclosed herein advantageously result in a substantial reduction in the printed circuit board surface area required to implement a power converter.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described herein, but many rearrangements, modifications, and substitutions are possible without departing from the scope of the present disclosure.

The invention claimed is:

1. A semiconductor package comprising:
  a driver IC (Integrated Circuit), a control transistor, and a sync transistor of a power converter, wherein said driver IC and said control and sync transistors are attached over a first patterned conductive carrier and said driver IC is configured to drive said control and sync transistors to develop a voltage at a switch node of said power converter;
  a magnetic material situated over a plurality of leads of said first patterned conductive carrier;
  a second patterned conductive carrier that is not attached over said driver IC and is attached over said plurality of leads of said first patterned conductive carrier, said control and sync transistors, and said magnetic material;
  wherein a plurality of leads of said second patterned conductive carrier overlie said magnetic material and said control and sync transistors and are coupled to said plurality of leads of said first patterned conductive carrier so as to form said switch node of said power converter and windings of an output inductor for said power converter, said output inductor being integrated into said semiconductor package.

2. The semiconductor package of claim 1, wherein said magnetic material comprises a magnetic core.

3. The semiconductor package of claim 1, wherein said magnetic material comprises a molding compound impregnated with magnetic particles.

4. The semiconductor package of claim 1, wherein a drain of said control transistor is attached to a control drain segment of said first patterned conductive carrier.

5. The semiconductor package of claim 1, wherein a source of said sync transistor is attached to a sync source segment of said first patterned conductive carrier.

6. The semiconductor package of claim 1, wherein said second patterned conductive carrier couples a source of said control transistor to a drain of said sync transistor to provide said switch node of said power converter.

7. The semiconductor package of claim 1, wherein said control and sync transistors comprise silicon transistors.

8. The semiconductor package of claim 1, wherein said control and sync transistors comprise group III-V transistors.

9. The semiconductor package of claim 1, wherein said first patterned conductive carrier comprises a portion of a lead frame.

10. The semiconductor package of claim 1, wherein said second patterned conductive carrier comprises a portion of a lead frame.

11. A method for fabricating a semiconductor package, said method comprising:
  attaching a driver IC (Integrated Circuit), a control transistor and a sync transistor of a power converter over a first patterned conductive carrier, wherein said driver IC is configured to drive said control and sync transistors to develop a voltage at a switch node of said power converter;
  situating a magnetic material over a plurality of leads of said first patterned conductive carrier;
  attaching a second patterned conductive carrier over said plurality of leads of first patterned conductive carrier, said control and sync transistors, and said magnetic material and not over said driver IC;
  wherein a plurality of leads of said second patterned conductive carrier overlie said magnetic material and said control and sync transistors and are coupled to said plurality of leads of said first patterned conductive carrier so as to form said switch node of said power converter and windings of an output inductor for said power converter, said output inductor being integrated into said semiconductor package.

12. The method of claim 11, wherein said magnetic material comprises a magnetic core.

13. The method of claim 11, wherein said magnetic material comprises a molding compound impregnated with magnetic particles.

14. The method of claim 11, wherein a drain of said control transistor is attached to a control drain segment of said first patterned conductive carrier.

15. The method of claim 11, wherein a source of said sync transistor is attached to a sync source segment of said first patterned conductive carrier.

16. The method of claim 11, wherein said second patterned conductive carrier couples a source of said control transistor to a drain of said sync transistor to provide said switch node of said power converter.

17. The method of claim 11, wherein said control and sync transistors comprise silicon transistors.

18. The method of claim 11, wherein said control and sync transistors comprise group III-V transistors.

* * * * *